(12) United States Patent
Hsu et al.

(10) Patent No.: US 11,729,905 B2
(45) Date of Patent: Aug. 15, 2023

(54) STRETCHABLE CIRCUIT AND LAYOUT METHOD FOR STRETCHABLE CIRCUIT

(71) Applicant: Industrial Technology Research Institute, Hsinchu (TW)

(72) Inventors: Yu-Lin Hsu, Tainan (TW); Hung-Hsien Ko, Hsinchu County (TW); Ting-Yu Ke, Changhua County (TW); Ting-Yu Wang, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 17/221,717

(22) Filed: Apr. 2, 2021

(65) Prior Publication Data

US 2022/0183149 A1 Jun. 9, 2022

(30) Foreign Application Priority Data

Dec. 9, 2020 (TW) .................................. 109143427

(51) Int. Cl.
*H05K 1/02* (2006.01)
*H01L 27/32* (2006.01)
*H05K 3/00* (2006.01)

(52) U.S. Cl.
CPC ......... *H05K 1/0283* (2013.01); *H05K 3/0005* (2013.01); *H05K 2201/055* (2013.01)

(58) Field of Classification Search
CPC ........ H05K 1/02; H05K 1/0283; H05K 1/038; H05K 1/147; H05K 3/05; H05K 2201/05; H05K 2201/0133; H01L 27/32; A61F 2007/026; A61F 2007/0052; A61F 2007/0071; A61F 2007/0094; A61F 2007/0098
USPC .......................................... 174/254; 257/773
See application file for complete search history.

(56) References Cited

U.S. PATENT DOCUMENTS

| | | | | |
|---|---|---|---|---|
| 4,736,752 A | * | 4/1988 | Munck | ................. A61N 1/0456 607/152 |
| 2015/0380355 A1 | * | 12/2015 | Rogers | ................ H01L 23/5387 257/773 |
| 2017/0181276 A1 | * | 6/2017 | Sawada | .................... B32B 27/38 |
| 2018/0073172 A1 | * | 3/2018 | Kurahashi | ................ D02G 3/36 |
| 2018/0192520 A1 | | 7/2018 | Choong et al. | |
| 2019/0292688 A1 | * | 9/2019 | Omenetto | ........... B81C 99/0085 |
| 2020/0159982 A1 | | 5/2020 | Pan et al. | |

(Continued)

FOREIGN PATENT DOCUMENTS

CN 101661523 B 6/2012
CN 107113965 A 8/2017
(Continued)

OTHER PUBLICATIONS

Taiwan Patent Office, Office Action, Patent Application Serial No. 109143427, dated Jan. 21, 2022, Taiwan.

*Primary Examiner* — Xiaoliang Chen

(57) ABSTRACT

A stretchable circuit is provided in the invention. The stretchable circuit comprises a plurality of segments. Each segment includes a plurality of sub-segments. Each sub-segment includes at least one main line, at least one secondary line, and rib lines, and in each sub-segment, the main lines and the secondary lines are electrically connected to the rib lines.

12 Claims, 6 Drawing Sheets extension direction: X-direction

(56) References Cited

U.S. PATENT DOCUMENTS

| | | | | |
|---|---|---|---|---|
| 2020/0323680 A1* | 10/2020 | Hussain | ............... | A61F 7/007 |
| 2020/0333829 A1* | 10/2020 | Martinez | ............... | D21H 27/00 |
| 2021/0027673 A1* | 1/2021 | Kim | ............... | H01L 27/3276 |
| 2021/0098555 A1* | 4/2021 | Kim | ............... | H01L 27/326 |
| 2021/0126082 A1* | 4/2021 | Yoon | ............... | H01L 27/3276 |
| 2021/0158734 A1* | 5/2021 | Kim | ............... | H01L 51/0097 |
| 2021/0183962 A1* | 6/2021 | Kim | ............... | G09G 3/035 |

FOREIGN PATENT DOCUMENTS

| | | |
|---|---|---|
| TW | I611824 | 1/2018 |
| TW | 202005489 A | 1/2020 |
| TW | 202021432 A | 6/2020 |

\* cited by examiner

STRETCHABLE CIRCUIT AND LAYOUT METHOD FOR STRETCHABLE CIRCUIT

CROSS REFERENCE TO RELATED APPLICATIONS

This application claims priority of TW Patent Application No. 109143427 filed on Dec. 9, 2020, the entirety of which is incorporated by reference herein.

BACKGROUND OF THE INVENTION

Field of the Invention

The invention generally relates to stretchable circuit technology, and more particularly, to a stretchable circuit technology in which the main lines and secondary lines are configured in the stretchable circuit.

Description of the Related Art

As technology has progressed, the physiological signals (e.g. electrocardiography (ECG) signals, electromyography (EMG) signals, and so on) of the human body can be measured by wearable products (e.g. smart clothes, smart pants, assistive devices, and so on).

In addition, in order to reduce the difficulty of the layout of the circuit in the wearable products, stretchable materials may be used in the design of the measuring circuitry configured in these wearable products. However, in the structure of a traditional stretchable circuit designed for stretchable materials, only the stress variance between two ends of one segment of the stretchable circuit can be measured, whereas stress variances in the different sub-segments of the segment of the stretchable circuit cannot be measured. Therefore, the layout of the circuit in the wearable products cannot be designed accurately.

BRIEF SUMMARY OF THE INVENTION

A stretchable circuit and layout method for the stretchable circuit are provided to overcome the problems mentioned above.

An embodiment of the invention provides a stretchable circuit. The stretchable circuit comprises a plurality of segments. Each segment comprises a plurality of sub-segments. Each sub-segment comprises at least one main line, at least one secondary line, and rib lines, and in each sub-segment, the main lines and the secondary lines are electrically connected to the rib lines.

According to some embodiments of the invention, in each sub-segment, the widths of the main lines are greater than, equal to, or less than the widths of the secondary lines.

According to some embodiments of the invention, the main lines are configured in an inner ring and the secondary lines are configured in an outer ring, or the main lines are configured in an outer ring and the secondary lines are configured in an inner ring.

According to some embodiments of the invention, the sub-segments may all be the same size, or they may be different sizes.

According to some embodiments of the invention, the number of main lines in each sub-segment is the same or different.

According to some embodiments of the invention, the number of secondary lines in each sub-segment is the same or different.

According to some embodiments of the invention, in each sub-segment, the main line comprises a detection point for detecting the strain change or stress change in each sub-segment. According to some embodiments of the invention, the detection point is configured in a position in front of or behind a knee of the main line or configured in the rib line.

According to some embodiments of the invention, one of the segments is electrically connected to another one of the segments via a node.

According to some embodiments of the invention, the plurality of segments are arranged in serpentine line patterns, horseshoe patterns, wavy patterns or square patterns.

An embodiment of the invention provides a layout method for the stretchable circuit. The layout method for the stretchable circuit is applied to a stretchable circuit. The stretchable circuit comprises a plurality of segments, and each segment comprises a plurality of sub-segments, wherein each sub-segment comprises at least one main line, at least one secondary line, and rib lines, and in each sub-segment, the main lines and the secondary lines are electrically connected to the rib lines. The layout method for the stretchable circuit comprises the steps of obtaining strain distribution information or stress distribution information of a target area from a measurement carrier, wherein the measurement carrier is made up of the circuit structure of the stretchable circuit according to the circuit layout information stored in a layout database; adjusting the circuit layout information corresponding to the measurement carrier according to the strain distribution information or stress distribution information measured by the measurement carrier; and producing a carrier corresponding to the target area according to the adjusted circuit layout information.

Other aspects and features of the invention will become apparent to those with ordinary skill in the art upon review of the following descriptions of specific embodiments of stretchable circuit and layout method for the stretchable circuit.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
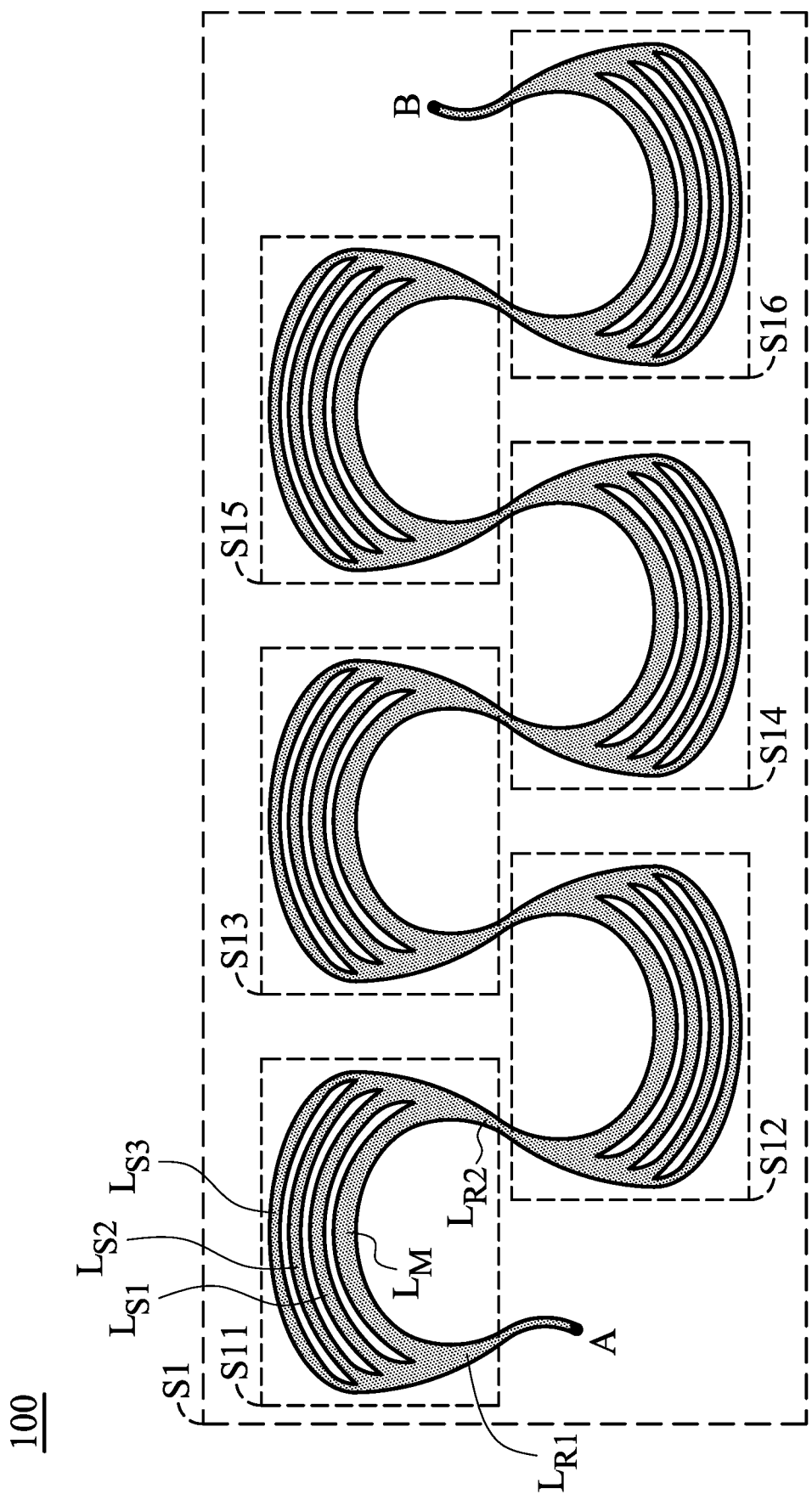
FIG. 1 is a block diagram of a stretchable circuit 100 according to an embodiment of the invention.

FIG. 1 is a block diagram of a stretchable circuit 100 according to an embodiment of the invention. The stretchable circuit 100 may be configured in the wearable products (e.g. smart clothes, smart pants, assistive devices, or protective clothing, but the invention should not be limited thereto). As shown in FIG. 1, the stretchable circuit 100 may comprise at least one first segment S1. It should be noted that FIG. 1 presents a simplified block diagram in which only the elements relevant to the invention are shown. However, the invention should not be limited to what is shown in FIG. 1. The stretchable circuit 100 may also comprise other segments or other lines and elements.

According to the embodiments of the invention, the stretchable circuit 100 may be made of stretchable materials (e.g. silver paste, carbon paste, copper foil, but the invention should not be limited thereto). According to an embodiment of the invention, each segment of the stretchable circuit 100 may be arranged in a serpentine line pattern, a horseshoe pattern, a wavy pattern, or a square pattern, but the invention should not be limited thereto. According to an embodiment of the invention, the design parameters of the stretchable circuit 100 may comprise the widths of the main lines, the secondary lines and the rib lines, the lengths of the main lines, the secondary lines and the rib lines, the number of main lines and secondary lines, the arc angles of the main lines and the secondary lines, the distance between the main lines and the secondary lines, and the centerline radius, but the invention should not be limited thereto. According to an embodiment of the invention, the extension direction of each segment of the stretchable circuit 100 is the X-direction.

As shown in FIG. 1, the first segment S1 may comprise a first sub-segment S11, a second sub-segment S12, a third sub-segment S13, a fourth sub-segment S14, a fifth sub-segment S15, a sixth sub-segment S16, a first endpoint A, and a second endpoint B. It should be noted that the first segment S1 of FIG. 1 is only used to illustrate the embodiments of the invention, and the invention should not be limited thereto. Each segment may also comprise a different number of sub-segments.

According to an embodiment of the invention, each sub-segment may comprise at least one main line, at least one secondary line, and two rib lines. In an embodiment of the invention, the main lines may be configured in the inner ring of the sub-segment, and the secondary lines may be configured in the outer ring of the sub-segment. In another embodiment of the invention, the secondary lines may be configured in the inner ring of the sub-segment, and the main lines may be configured in the outer ring of the sub-segment. In addition, the main lines of the secondary lines in each sub-segment may be electrically connected to the two rib lines. Taking first sub-segment S11 of FIG. 1 as an example, the sub-segment S11 may comprise a main line $L_M$, a first secondary line $L_{S1}$, a second secondary line $L_{S2}$, a third secondary line $L_{S3}$, a first rib line $L_{R1}$ and a second rib line $L_{R2}$. As shown in FIG. 1, the main line $L_M$ is configured in the innermost ring of the sub-segment S11, and the first secondary line $L_{S1}$, the second secondary line $L_{S2}$, and the third secondary line $L_{S3}$ are configured in the outer ring of the sub-segment S11, but the invention should not be limited thereto. In addition, as shown in FIG. 1, the two ends of the main line $L_M$, the first secondary line $L_{S1}$, the second secondary line $L_{S2}$, and the third secondary line $L_{S3}$ are electrically connected to the first rib line $L_{R1}$ and the second rib line $L_{R2}$ respectively. It should be noted that the number of main lines and secondary lines in each sub-segment is not limited to what is depicted in FIG. 1. In the embodiments of the invention, the secondary lines of each sub-segment may compensate for the electrical properties of each sub-segment to ensure that the two ends of the sub-segment have stable resistivity. Therefore, in the embodiments of the invention, the strain change or stress change in each sub-segment can be detected to provide stress information that corresponds to each sub-segment. Details are illustrated in the embodiments below.

According to an embodiment of the invention, in each sub-segment, the widths of all main lines may be greater than, equal to, or less than the widths of the secondary lines. Taking the sub-segment S11 of claim 1 as an example, the width of the main line $L_M$ is greater than the widths of the first secondary line $L_{S1}$, the second secondary line $L_{S2}$ and the third secondary line $L_{S3}$. According to an embodiment of the invention, when a sub-segment comprises more than one main line, the width of each main line may be the same or different. According to an embodiment of the invention, when a sub-segment comprises more than one secondary line, the width of each secondary line may be the same or different.

Figure 2:
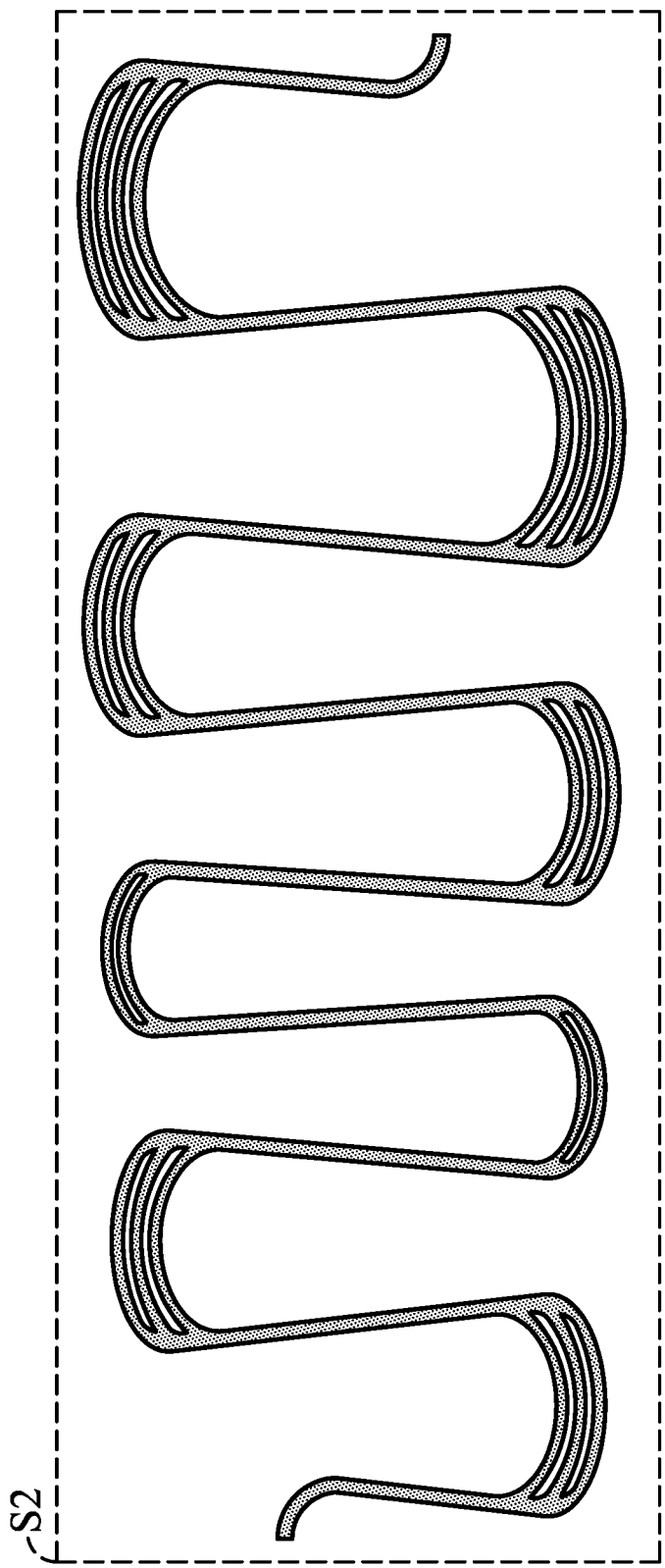
FIG. 2 is a schematic diagram of a second segment S2 according to an embodiment of the invention.

According to an embodiment of the invention, the size or arc angle of each sub-segment may be the same or different. In addition, according to an embodiment of the invention, the number of main lines and secondary lines in each sub-segment may be the same or different. As shown in FIG. 2, the sub-segments of the segment S2 may be different sizes. In addition, as shown in FIG. 2, each of the sub-segments of the segment S2 may have a different number of main lines and secondary lines. It should be noted that the segment S2 of FIG. 2 is only used to illustrate the embodiments of the invention, and the invention should not be limited thereto.

Figure 3:
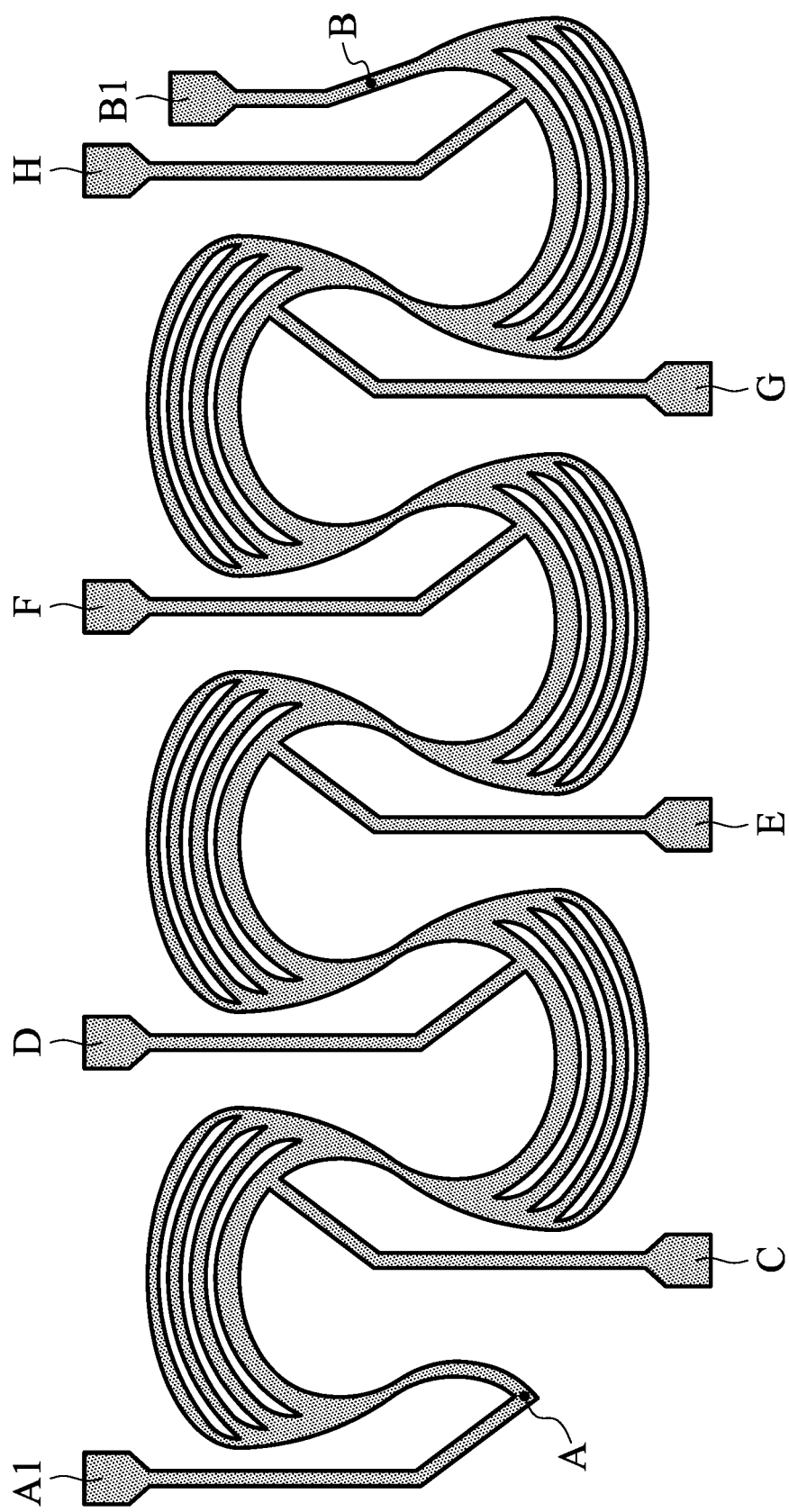
FIG. 3 is a schematic diagram of the detection points according to an embodiment of the invention.
Figure 4:
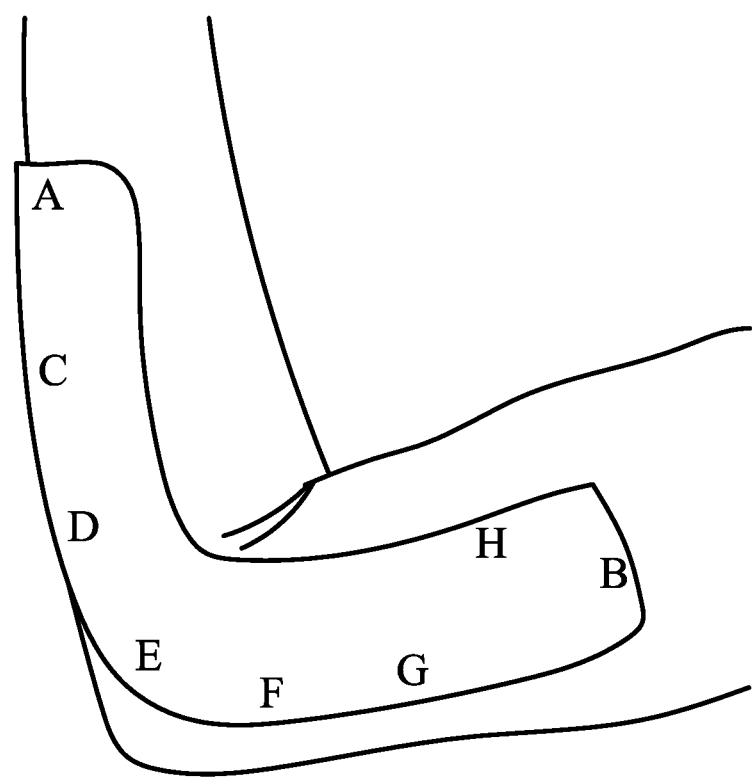
FIG. 4 is a schematic diagram of a first segment S1 configured in the clothes or protective clothing of the arm of the user according to an embodiment of the invention.

According to an embodiment of the invention, in each sub-segment, each main line may comprise a detection point which is used to detect the resistance change of each sub-segment to obtain the strain change or the stress change in each sub-segment. Taking FIG. 1 and FIG. 3 as an example, a detection point C is configured in the first sub-segment S11, a detection point D is configured in the second sub-segment S12, a detection point E is configured in the third sub-segment S13, a detection point F is configured in the fourth sub-segment S14, a detection point G is configured in the fifth sub-segment S15, and a detection point H is configured in the sixth sub-segment S16. In the embodiment, a detection circuit (not shown in figures) may be used to detect the stress value between the detection point A pulled from the first endpoint A and the detection point C to obtain the strain change or stress change of the first sub-segment S11, detect the stress value between the detection point A pulled from the first endpoint A and the detection point D to obtain the strain change or stress change of the second sub-segment S12, detect the stress value between the detection point A pulled from the first endpoint A and the detection point E to obtain the strain change or stress change of the third sub-segment S13, detect the stress value between the detection point A pulled from the first endpoint A and the detection point F to obtain the strain change or stress change of the fourth sub-segment S14, detect the stress value between the detection point A pulled from the first endpoint A and the detection point G to obtain the strain change or stress change of the fifth sub-segment S15, and detect the stress value between the detection point A pulled from the first endpoint A and the detection point H to obtain the strain change or stress change of the sixth sub-segment S16. In addition, in the embodiment of the invention, in each sub-segment, the detection point is configured in the position in front of or behind the knee (the area with the largest stress) of the main line. In another embodiment, the detection point is configured in the rib line. In the embodiment of FIG. 3, according to the obtained strain change or the stress change of different sub-segments of the first segment S1, the force distribution of the different sub-segments of the first segment S1 will be known. Taking FIG. 4 as an example, if the first segment S1 is configured in the clothes or protective clothing of the arm of the user, according to the obtained strain change or the stress change of different sub-segments of the first segment S1, the force distribution of the different sub-segments of the first segment S1 will be known and is taken as reference for the circuit layout.

Figure 5:
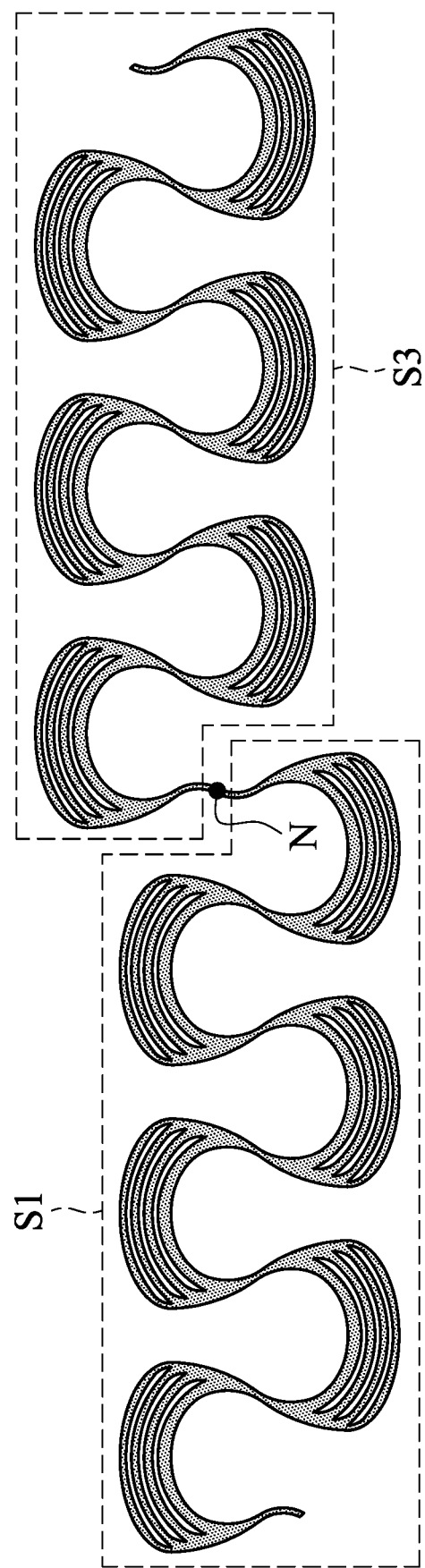
FIG. 5 is a schematic diagram of a node according to an embodiment of the invention.

According to an embodiment of the invention, when the stretchable circuit 100 comprises a plurality of segments, a segment can be coupled to (or electrically connected to) another segment of the stretchable circuit 100 via a node to reduce the strain value or the stress value generated at the junction of the two segments when the stretchable circuit 100 is extended. Taking FIG. 5 as an example, the stretchable circuit 100 may further comprise a third segment S3. The endpoint B of the segment S1 may be coupled to one end of the segment S3 via the node N. In addition, in the embodiment, the endpoint A of the segment S1 may be also coupled to another segment of the stretchable circuit 100 or coupled to an electrode or conducting wire via another node, and the other end of the segment S3 may be also coupled to another segment of the stretchable circuit 100 or coupled to an electrode or conducting wire via another node. According to an embodiment of the invention, for the layout of the node N, the node N can be a round dot.

Figure 6:
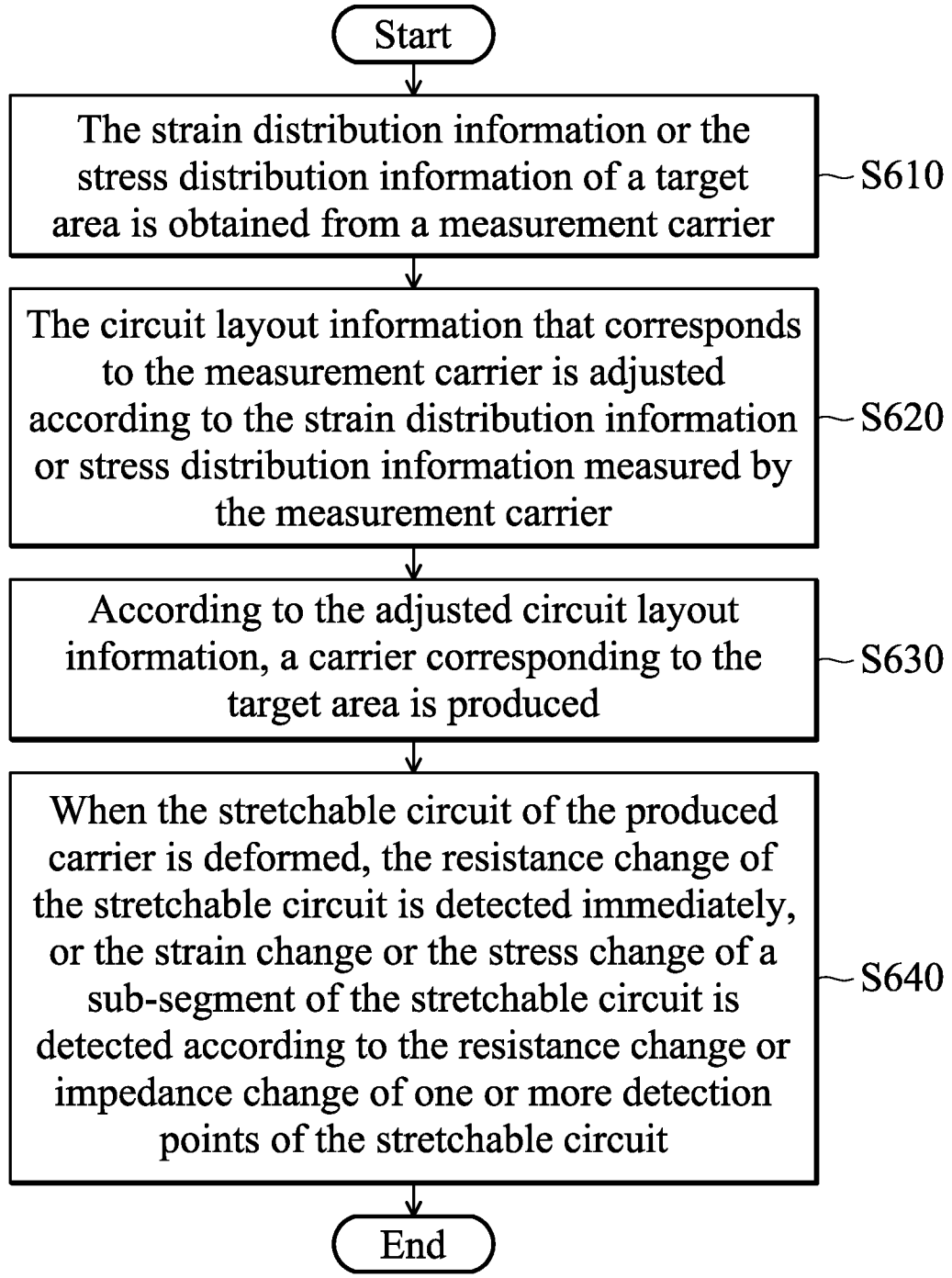
FIG. 6 is a flow chart illustrating a layout method for the stretchable circuit according to an embodiment of the invention.

FIG. 6 is a flow chart illustrating a layout method for a stretchable circuit according to an embodiment of the invention. The layout method for a stretchable circuit can be applied to the stretchable circuit 100. As shown in FIG. 6, in step S610, the strain distribution information or the stress distribution information of a target area (e.g. the arm of the user, but the invention should not be limited thereto) is obtained from a measurement carrier (e.g. a smart clothes), wherein the measurement carrier is made up of the circuit structure of stretchable circuit 100 according to the circuit layout information stored in a layout database.

According to embodiments of the invention, the layout database may store the circuit layout information corresponding to different strain distribution information or stress distribution information. The circuit layout information may comprise the circuit layout of the stretchable circuit 100, the layout of the electrodes, the layout of the conducting wire, and so on.

In step S620, the circuit layout information that corresponds to the measurement carrier is adjusted according to the strain distribution information or stress distribution information measured by the measurement carrier. According to the embodiments of the invention, the adjusted circuit layout information may be stored in the layout database.

In step S630, according to the adjusted circuit layout information, a carrier corresponding to the target area is produced.

In step S640, when the stretchable circuit of the produced carrier is deformed, the resistance change of the stretchable circuit is detected immediately, or the strain change or the stress change of a sub-segment of the stretchable circuit is detected according to the resistance change or impedance change of one or more detection points of the stretchable circuit.

According to the embodiments of the invention, the layout method for a stretchable circuit may be performed through a circuit layout platform.

According to the layout method for a stretchable circuit provided in the invention, in the structure of the stretchable circuit 100, the strain distribution information or stress distribution information of each sub-segment can be obtained for reference of designing the circuit layout.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A stretchable circuit, comprising:
a plurality of segments, wherein each segment is coupled to the next segment;
wherein each segment comprises a plurality of odd and even sub-segments arranged alternately in parallel and each odd sub-segment is coupled to the next even sub-segment, and
wherein each sub-segment comprises at least one main line, at least one secondary line, and rib lines, and in each sub-segment, the main lines and the secondary lines that are adjacent are electrically connected to the rib lines,
wherein the stretchable circuit is made of stretchable materials, and both the main lines and the secondary lines have the same arc angles.

2. The stretchable circuit of claim 1, wherein in each sub-segment, the widths of the main lines are greater than, equal to, or less than the widths of the secondary lines.

3. The stretchable circuit of claim 1, wherein the sub-segments are the same size or different sizes.

4. The stretchable circuit of claim 1, wherein the number of main lines in each sub-segment is the same or different.

5. The stretchable circuit of claim 1, wherein the number of secondary lines in each sub-segment is the same or different.

6. The stretchable circuit of claim 1, wherein in each sub-segment, the main line comprises a detection point for detecting strain change or stress change in each sub-segment.

7. The stretchable circuit of claim 6, wherein the detection point is configured in a position in front of or behind a knee of the main line or configured in the rib line.

8. The stretchable circuit of claim 1, wherein one of the plurality of segments is electrically connected to another one of the plurality of segments via a node.

9. The stretchable circuit of claim 1, wherein the plurality of segments are arranged in serpentine line patterns, horseshoe patterns, wavy patterns, or square patterns.

10. The stretchable circuit of claim 1, wherein the main lines are configured in an inner ring and the secondary lines are configured in an outer ring, or the main lines are configured in the outer ring and the secondary lines are configured in the inner ring.

11. The stretchable circuit of claim 1, wherein the plurality of odd and even sub-segments have the same arc angles, and the curve direction of the plurality of odd and even sub-segments alternates between upward and downward.

12. The stretchable circuit of claim 1, wherein one of the plurality of segments, along with the adjacent segment, is being elongated to minimize the strain change at the junction between the two segments.

* * * * *